United States Patent
Foster, Sr. et al.

(10) Patent No.: US 7,827,445 B2
(45) Date of Patent: Nov. 2, 2010

(54) FAULT INJECTION IN DYNAMIC RANDOM ACCESS MEMORY MODULES FOR PERFORMING BUILT-IN SELF-TESTS

(75) Inventors: Jimmy G. Foster, Sr., Morrisville, NC (US); Nickolaus J. Gruendler, Raleigh, NC (US); Suzanne M. Michelich, Waukesha, WI (US); Jacques B. Taylor, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 495 days.

(21) Appl. No.: 11/960,489

(22) Filed: Dec. 19, 2007

(65) Prior Publication Data

US 2009/0164846 A1 Jun. 25, 2009

(51) Int. Cl.
*G06F 11/00* (2006.01)
*G06F 11/273* (2006.01)

(52) U.S. Cl. .............................. 714/41; 714/40; 714/42; 714/703

(58) Field of Classification Search .................. 714/40, 714/41, 42, 703
See application file for complete search history.

(56) References Cited

U.S. PATENT DOCUMENTS

| | | | |
|---|---|---|---|
| 5,671,352 A * | 9/1997 | Subrahmaniam et al. ...... | 714/41 |
| 5,961,653 A | 10/1999 | Kalter et al. | |
| 5,999,468 A * | 12/1999 | Lawrence .................... | 365/201 |
| 6,343,366 B1 | 1/2002 | Okitaka | |
| 6,543,016 B1 * | 4/2003 | Lewandowski et al. ..... | 714/718 |
| 6,567,950 B1 | 5/2003 | Bertin et al. | |
| 6,636,825 B1 | 10/2003 | Malladi et al. | |
| 6,799,287 B1 * | 9/2004 | Sharma et al. ............... | 714/703 |
| 6,842,867 B2 * | 1/2005 | Cooper ........................ | 714/42 |
| 6,886,116 B1 * | 4/2005 | MacLellan et al. ........... | 714/703 |
| 6,934,900 B1 | 8/2005 | Cheng et al. | |
| 7,076,706 B2 | 7/2006 | Eckelman et al. | |
| 7,089,461 B2 | 8/2006 | Gilbert et al. | |
| 7,149,945 B2 * | 12/2006 | Brueggen .................... | 714/758 |
| 7,234,081 B2 | 6/2007 | Nguyen et al. | |
| 7,334,159 B1 * | 2/2008 | Callaghan ..................... | 714/30 |
| 7,370,251 B2 * | 5/2008 | Nadeau-Dostie et al. ..... | 714/723 |
| 7,401,269 B2 * | 7/2008 | Hoda et al. .................. | 714/703 |
| 2002/0064033 A1 | 5/2002 | Deane et al. | |

OTHER PUBLICATIONS

Fifield, et al.; Self-Test Feature for On-Chip Error Correction Code System; TDB May 1989; 1989; pp. 64-65; Burlington.

* cited by examiner

*Primary Examiner*—Scott T Baderman
*Assistant Examiner*—Joseph Schell
(74) *Attorney, Agent, or Firm*—Edward J. Lenart; Cynthia G. Seal; Biggers & Chanian, LLP

(57) ABSTRACT

Fault injection in dynamic random access memory ('DRAM') modules for performing built-in self-tests ('BISTs') including establishing, in the mode registers of the DRAM modules by the memory controller through the shared address bus, an injection of a fault into one or more signal lines of a DRAM module, the fault characterized by a fault type; writing data by the memory controller through a data bus to the DRAM modules, the data identifying a particular DRAM module; and responsive to receiving the data, injecting, by the particular DRAM module, the fault characterized by the fault type into the one or more signal lines of the particular DRAM module.

17 Claims, 3 Drawing Sheets

FAULT INJECTION IN DYNAMIC RANDOM ACCESS MEMORY MODULES FOR PERFORMING BUILT-IN SELF-TESTS

BACKGROUND OF THE INVENTION

1. Field of the Invention

The field of the invention is data processing, or, more specifically, dynamic random access memory ('DRAM') modules, methods, and apparatus, for fault injection for performing built-in self-tests ('BISTs').

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago. Compute systems today have complex and sometimes expensive memory subsystems. Typical memory subsystems may include many dynamic random access memory ('DRAM') modules. During manufacture, DRAM modules are typically tested under various fault conditions to determine typical DRAM module behavior during such a fault. DRAM modules during these tests are purposefully injected with a fault. Such fault injection may include physically cutting pins of the DRAM module, physically soldering pins together, or physically connecting a voltage source to pins of the DRAM module. Such a testing procedure is expensive, in terms of both time and money, because the test is manually administered and because the tested DRAM module cannot be put into production but must be discarded.

SUMMARY OF THE INVENTION

DRAM modules, methods, and apparatus for fault injection for performing built-in self-tests ('BISTs') are disclosed. The DRAM module includes a§ mode register, the mode register connected to a memory controller through a shared address bus, the mode register includes: a segment indicating whether to inject a fault into one or more signal lines of the DRAM module; a segment identifying one or more signal lines of the DRAM module on which to inject a fault; and a segment including a fault type.

The methods and apparatus include DRAM modules managed by a memory controller, each DRAM module including a mode register, the mode registers of the DRAM modules connected to the memory controller through a shared address bus, each mode register including a segment indicating whether to inject a fault into one or more signal lines of a DRAM module, a segment identifying one or more signal lines of a DRAM module on which to inject a fault, and a segment including a fault type. The methods and apparatus also include establishing, in the mode registers of the DRAM modules by the memory controller through the shared address bus, an injection of a fault into one or more signal lines of a DRAM module, the fault characterized by a fault type; writing data by the memory controller through a data bus to the DRAM modules, the data identifying a particular DRAM module; and responsive to receiving the data, injecting, by the particular DRAM module, the fault characterized by the fault type into the one or more signal lines of the particular DRAM module.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
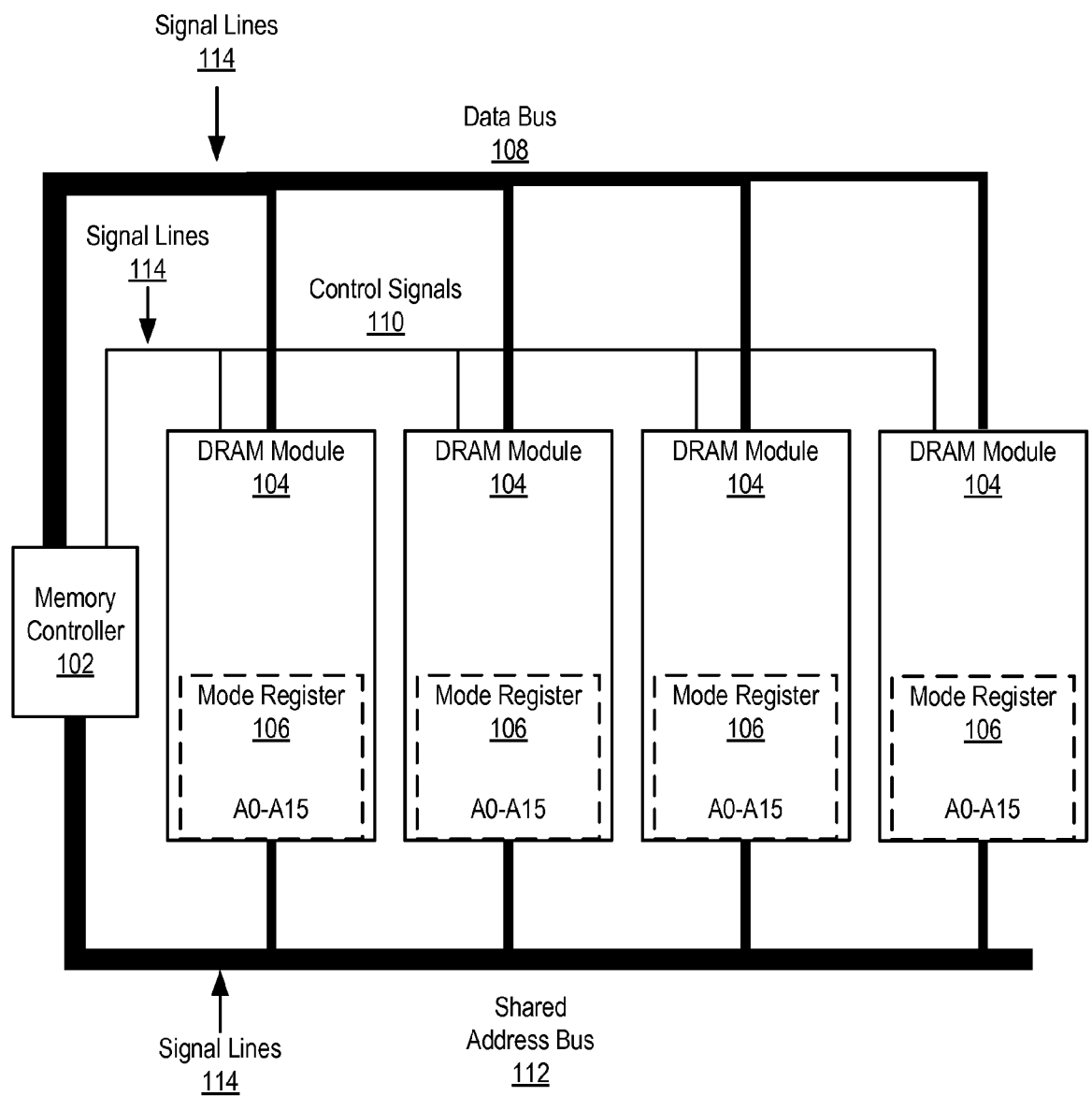
FIG. 1 sets forth a functional block diagram of a system for fault injection in DRAM modules for performing BISTs.

Exemplary dynamic access memory modules, apparatus, and products for fault injection in dynamic random access memory ('DRAM') modules for performing built-in self-tests ('BISTs') in accordance with the present invention are described with reference to the accompanying drawings, beginning with FIG. 1. FIG. 1 sets forth a functional block diagram of a system for fault injection in DRAM modules for performing BISTs. A BIST mechanism within an integrated circuit, in this case within a DRAM module, is a function that verifies all or a portion of the internal functionality of the integrated circuit. The main purpose of BISTs is to reduce the complexity, and thereby decrease cost and reduce reliance upon, external test equipment for integrated circuits. The DRAM modules of FIG. 1 may execute a BIST after a fault is injected into one or more signal lines of the DRAM module.

The system of FIG. 1 includes a memory controller (102), an aggregation of hardware and firmware, which manages several DRAM modules (104). A memory controller manages the DRAM modules (104) in the sense that the memory controller directs the flow of data stored on the DRAM modules through a data bus (108), addresses the DRAM modules through the shared address bus (112), and controls operation of the DRAM modules through the control signals (110).

Address lines are typically used to identify particular memory location in the DRAM modules. The exemplary address bus (112) of FIG. 1 is described as a 'shared' address bus because each of the signal lines (114) making up the address bus is connected to each of the DRAM modules. A signal on address signal line A0, for example, is received by all of the DRAM modules in the system of FIG. 1.

Control signals (110) include various signal lines that control operation of a DRAM module. Examples of typical control signals include, for example:

/RAS, the Row Address Strobe. The address inputs are captured on the falling edge of /RAS, and select a row to open. The row is held open as long as /RAS is low.

/CAS, the Column Address Strobe. The address inputs are captured on the falling edge of /CAS, and select a column from the currently open row to read or write.

/WE, Write Enable. This signal determines whether a given falling edge of /CAS is a read or write.

/OE, Output Enable. This is an additional signal that controls output to the data I/O pins of a DRAM module.

Each DRAM module (104) in the example of FIG. 1 includes a mode register (106). A mode register in a DRAM module is typically used to define basic operation of the DRAM module, or more specifically, define a mode in which the DRAM module will operate. A mode register is typically set up only once during initialization of the DRAM module. Operating parameters of a DRAM module that may be set through use of a typical mode register include burst length, burst type, and CAS latency. Operating parameter are typically set in the mode register by modifying segments of the mode register during a load mode register cycle through address lines connected to the DRAM module. The segments of the mode register may be thought of as one or more pins of the DRAM module connected to address lines. Modifying segments of a mode register then includes setting one or more pins of the DRAM module high or low through the use of the address lines connected to the DRAM module. Consider the following table as an example of typical mode register architecture having several segments:

TABLE 1

Typical Mode Register Architecture

| | |
|---|---|
| A0 | Burst Length |
| A1 | |
| A2 | |
| A3 | Burst Type |
| A4 | CAS Latency |
| A5 | |
| A6 | |
| A7 | Operating Mode |
| A8 | |
| A9 | Write Burst Mode |
| A10 | Reserved |
| A11 | |
| A12 | |
| A13 | |
| A14 | |
| A15 | |
| BA0 | |
| BA1 | |
| BA2 | |

In the example of Table 1, the mode register architecture includes several segments such as, a segment identifying a burst length, a segment identifying a burst type, a segment identifying Column Address Strobe ('CAS') latency, a segment identifying an operating mode and a segment identifying a write burst mode. A memory controller may configure the burst length segment of the mode register by setting address lines A0, A1, or A2 high or low during a load mode register cycle. The memory controller may also configure the burst type segment by setting address line A3 high or low during a load mode register cycle. The memory controller may also configure the CAS latency segment by setting address lines A4, A4, or A6 high or low during a load mode register cycle. The memory controller may also configure the operating mode segment by setting address lines A7 or A8 high or low during a load mode register cycle. The memory controller may also configure the write burst mode segment by setting address line A9 high or low during a load mode register cycle. All of the segments represented in the example of Table 1 may be configured during a single load mode register cycle.

In addition to the operating parameters the mode register architecture depicted in Table 1 also includes a segment that is reserved for future use. Setting address lines A10-BA2 high or low will have no effect on the operation of the DRAM module. The reserved segment in the example of Table 1, however, may be parsed into multiple segments that will have an effect on the operation of the DRAM module. Mode registers useful in fault injection in DRAM modules in accordance with embodiments of the present invention, for example, may be configured to use existing mode register architectures by using the reserved segments of the existing mode registers. Alternative mode registers useful in fault injection in DRAM modules in accordance with embodiments of the present invention may be configured with a completely new mode register architecture for DRAM modules.

Mode registers useful in fault injection in DRAM modules include a segment indicating whether to inject a fault into one or more signal lines of a DRAM module, a segment identifying one or more signal lines of a DRAM module on which to inject a fault, and a segment including a fault type. Consider Table 2 below as an example mode register architecture that includes several segments useful in fault injection of DRAM modules according to embodiments of the present invention:

TABLE 2

Mode Register Architecture Having Fault Injection Segments

| | |
|---|---|
| A0 | Reserved |
| A1 | |
| A2 | |
| A3 | Inject Fault |
| A4 | Signal Line To |
| A5 | Inject Fault |
| A6 | |
| A7 | |
| A8 | |
| A9 | |
| A10 | |
| A11 | Fault Type |
| A12 | |
| A13 | |
| A14 | |
| A15 | Reserved |
| BA0 | |
| BA1 | |
| BA2 | |

In the example of Table 2, the mode register architecture includes several segments useful for fault injection in DRAM modules, such as a segment indicating whether to inject a fault into one or more signal lines of a DRAM module, a segment identifying one or more signal lines of a DRAM module on which to inject a fault, and a segment including a fault type. The memory controller may indicate whether to inject a fault by setting address line A3 high or low during a load mode register cycle. The memory controller may also identify one or more signal lines on which to inject a fault by setting address lines A4-A10 high or low during a load mode register cycle. A memory controller may also identify a fault type by setting address lines A11-A14 high or low during a load mode register cycle.

The system of FIG. 1 operates generally for fault injection in DRAM modules for performing BISTs in accordance with embodiments of the present invention by establishing, in the mode registers of the DRAM modules by the memory controller through the shared address bus, an injection of a fault into one or more signal lines of a DRAM module, the fault characterized by a fault type. The signal lines of the DRAM module may include any signal line, such as a data line from the data bus, an address line from the address bus, or a control signal line.

The system of FIG. 1 also operates generally for fault injection in DRAM module for performing BISTs in accordance with embodiments of the present invention by writing data by the memory controller through a data bus to the DRAM modules, the data identifying a particular DRAM module and responsive to receiving the data, injecting, by the particular DRAM module, the fault characterized by the fault type on the one or more signal lines of the particular DRAM module.

Writing data by the memory controller through a data bus to the DRAM modules, the data identifying a particular DRAM module and responsive to receiving the data, may be carried out by setting, by the memory controller, data lines connected to the particular DRAM module high and setting data lines connected to other DRAM modules low during a write command cycle. In the system of FIG. 1, for example, each of DRAM modules is connected to the memory controller through unique data lines. That is, unlike the address bus (112), the data bus (108) is not shared. Consider for explanation that data bus (108) in the example of FIG. 1 includes 32 data lines and 8 different data lines are connected to each DRAM module. In such an example setting 8 data lines connected to a single DRAM module high during a write command cycle uniquely identifies that DRAM module. Readers of skill in the art will recognize that a fault may be injected into any number of DRAM modules in accordance with embodiments of the present invention by setting each of the DRAM modules' data lines high. Readers of skill in the art will also recognize that, in addition to setting all data lines of a DRAM module high, a DRAM module in accordance with embodiments of the present invention may also be uniquely identified by setting the data lines low or setting some data lines high and some low in a preconfigured, recognizable combination.

The arrangement of DRAM modules, busses, signal lines, memory controller and mode registers making up the exemplary system illustrated in FIG. 1 are for explanation, not for limitation. Systems useful according to various embodiments of the present invention may include additional buffers, DRAM modules, memory controllers, Dual In-line Memory Modules ('DIMMs'), channels, not shown in FIG. 1, as will occur to those of skill in the art. Various embodiments of the present invention may be implemented on a variety of hardware platforms in addition to those illustrated in FIG. 1.

Figure 2:
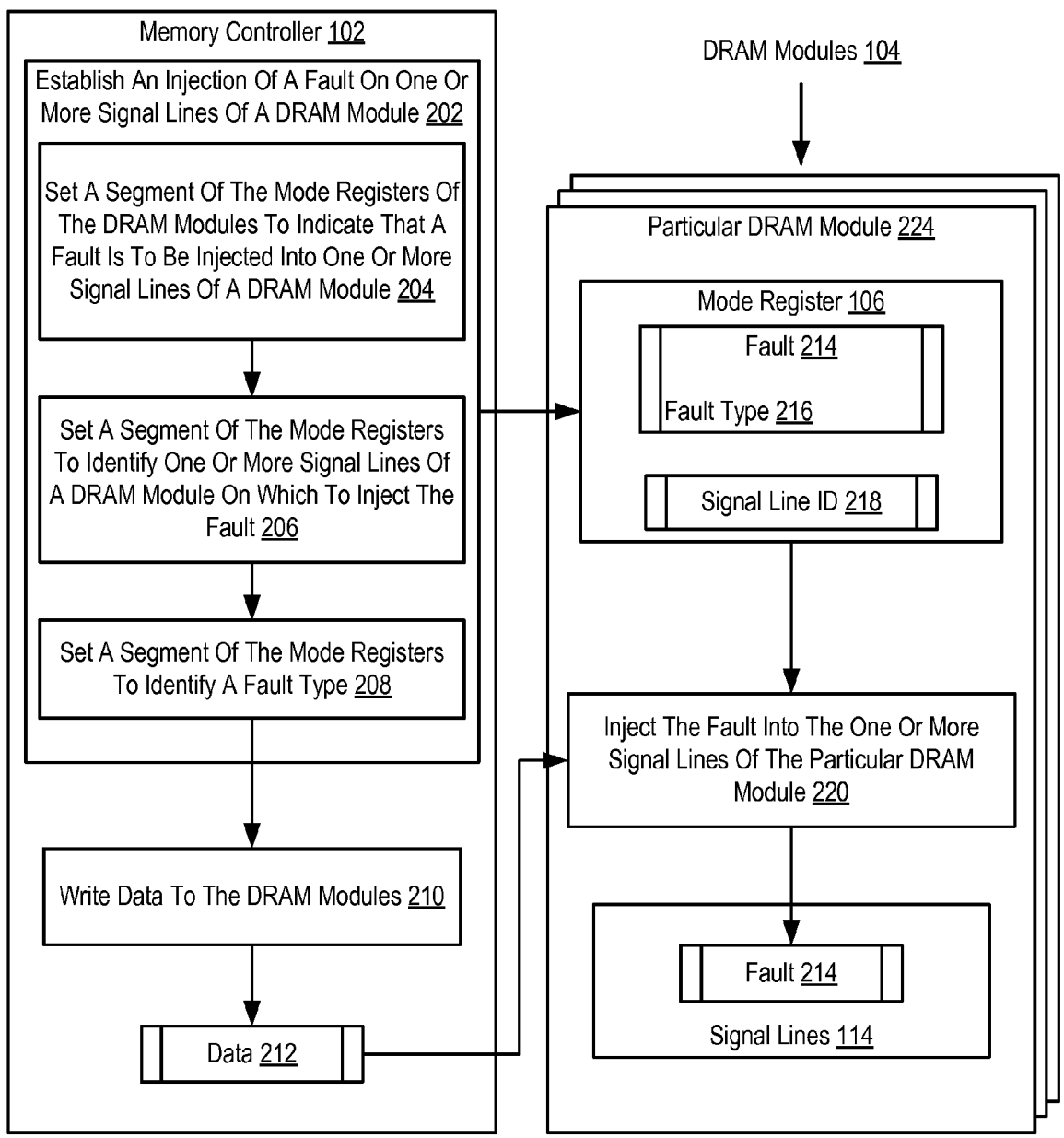
FIG. 2 sets forth a flow chart illustrating an exemplary method for fault injection in dynamic random access memory ('DRAM') modules for performing built-in self-tests ('BISTs') according to embodiments of the present invention.

For further explanation, FIG. 2 sets forth a flow chart illustrating an exemplary method for fault injection in dynamic random access memory ('DRAM') modules for performing built-in self-tests ('BISTs') according to embodiments of the present invention. In the method of FIG. 2, the DRAM modules (104) are managed by a memory controller (102) and each DRAM modules (104) includes a mode register (106). The mode registers (106) of the DRAM modules (104) are connected to the memory controller (102) through a shared address bus. Each mode register (106) includes a segment indicating whether to inject a fault into one or more signal lines of a DRAM module, a segment identifying one or more signal lines of a DRAM module on which to inject a fault, and a segment including a fault type.

The method of FIG. 2 includes establishing (202), in the mode registers (106) of the DRAM modules (104) by the memory controller (102) through the shared address bus, an injection of a fault (214) into one or more signal lines (114) of a DRAM module (104). In the method of FIG. 2, the fault (214) is characterized by a fault type (216).

In the method of FIG. 2, establishing (202) an injection of a fault (214) into one or more signal lines (114) of a DRAM module (104) is carried out by setting (204) a segment of the mode registers (106) of the DRAM modules (104) to indicate that a fault is to be injected into one or more signal lines of a DRAM module, setting (206) a segment of the mode registers to identify one or more signal lines of a DRAM module on which to inject the fault; and setting (208) a segment of the mode registers to identify a fault type. As mentioned above, the memory controller may set segments of the mode register by setting address lines associated with the segments high or low during a load mode register cycle.

The method of FIG. 2 also includes writing (210) data (212) by the memory controller (102) through a data bus to the DRAM modules (104), the data (212) identifying a particular DRAM module (224). As mentioned above, writing data to the DRAM modules where the data uniquely identifies a particular DRAM module may be carried out by setting a set of data lines connected to the particular DRAM module high during a write command cycle while setting all other data lines, those lines connected to other DRAM modules low during the write command cycle or in other ways as will occur to those of skill in the art.

Responsive to receiving the data (212), the method of FIG. 2 continues by injecting (220), by the particular DRAM module (224), the fault (214) characterized by the fault type (216) into the one or more signal lines (114) of the particular DRAM module (104). Injecting (220), by the particular DRAM module (224), the fault (214) characterized by the fault type (216) into the one or more signal lines (114) of the particular DRAM module (104) may be carried out by determining, by the particular DRAM module from a segment of the particular DRAM module's mode register, that a fault is to be injected into one or more signal lines of the particular DRAM; identifying, by the particular DRAM module from a segment of the particular DRAM module's mode register, the one or more signal lines on which to inject the fault; and identifying, by the particular DRAM module from a segment of the particular DRAM module's mode register, the fault type of the fault to inject.

DRAM modules useful for fault injection in accordance with embodiments of the present invention are implemented with associations of segment configurations, address lines set high or low during a load mode register cycle, and fault types. Continuing with the exemplary mode register architecture illustrated in Table 2, consider Table 3 below as an example of associations between configurations of the fault type segment of the mode register and actual types of faults to inject into one or more signal lines of the DRAM.

TABLE 3

Fault Type Segment Configurations Associated With Fault Types

| Config. No. | Segment Configurations | | | | Fault Type |
| | A14 | A13 | A12 | A11 | |
| --- | --- | --- | --- | --- | --- |
| 0 | 0 | 0 | 0 | 0 | Force High External |
| 1 | 0 | 0 | 0 | 1 | Force Low External |
| 2 | 0 | 0 | 1 | 0 | Disconnect External |
| 3 | 0 | 0 | 1 | 1 | Crosstalk 1 External |
| 4 | 0 | 1 | 0 | 0 | Crosstalk 2 External |
| 5 | 0 | 1 | 0 | 1 | Crosstalk 3 External |
| 6 | 0 | 1 | 1 | 0 | Crosstalk 4 External |
| 7 | 0 | 1 | 1 | 1 | Force High Internal |
| 8 | 1 | 0 | 0 | 0 | Force Low Internal |
| 9 | 1 | 0 | 0 | 1 | Disconnect Internal |

TABLE 3-continued

Fault Type Segment Configurations
Associated With Fault Types

| Config. No. | Segment Configurations | | | | Fault Type |
|---|---|---|---|---|---|
| | A14 | A13 | A12 | A11 | |
| 10 | 1 | 0 | 1 | 0 | Crosstalk 1 Internal |
| 11 | 1 | 0 | 1 | 1 | Crosstalk 2 Internal |
| 12 | 1 | 1 | 0 | 0 | Crosstalk 3 Internal |
| 13 | 1 | 1 | 0 | 1 | Crosstalk 4 Internal |

Table 3 includes thirteen configurations of the fault type segment of a DRAM module's mode register where each configuration is associated with a fault type. The first configuration of Table 3 is a configuration of the fault type segment where address lines A11-A14 are set low with an actual fault type of "Force High External." That is, when address lines A11-A14 are set low, one or more signal lines identified in a segment of the mode register are to be forced high externally. In some embodiments signal lines of a DRAM module pass through a buffer. That is a buffer lies between the memory controller and the DRAM module. To force a signal line of the DRAM module high externally then, the DRAM module may manipulate an output of the buffer to be high regardless of the input from the memory controller. In contrast. configuration number seven in Table 3 represents a fault type in which one or more signal lines are forced high internally. When such a fault is injected the DRAM module may manipulate its internal hardware, such as transistors, to force a signal line high regardless the actual input at the pin of the signal line. Table 3 also includes several other fault types such as introducing crosstalk into a signal line, forcing a signal line low, and disconnecting a signal line. Readers of skill in the art will recognize that these fault types are for explanation only not limitation and other fault types may be injected into DRAM modules in accordance with embodiments of the present invention and each such fault type is well within the scope of the present invention.

In the method of FIG. 2, then, injecting (220) the fault characterized by the fault type into the one or more signal lines of the particular DRAM module may include forcing one or more signal lines high, either externally or internally, forcing one or more signal lines low, either externally or internally, electrically disconnecting the one or more signal lines, either externally or internally, or introducing crosstalk between one or more signal lines. As mentioned above, the DRAM module may force signal lines high or low by manipulating internal hardware of the DRAM module or manipulating hardware of an external buffer connected tot eh signal lines. Likewise, the DRAM module may electrically disconnect a signal line by floating the signal line either by manipulating the DRAM module's internal hardware, such as transistors, or by manipulating an external buffer's hardware. Another fault type includes introducing crosstalk between one or more signal lines. Here, the DRAM module may again manipulate internal transistors to electrically connect one or more signal lines in order to combine the electrical signals carried by the signal lines onto one line. The DRAM module may also cause an external buffer to electrically connect several of the DRAM module's signal lines such that crosstalk between the signal lines is introduced.

Figure 3:
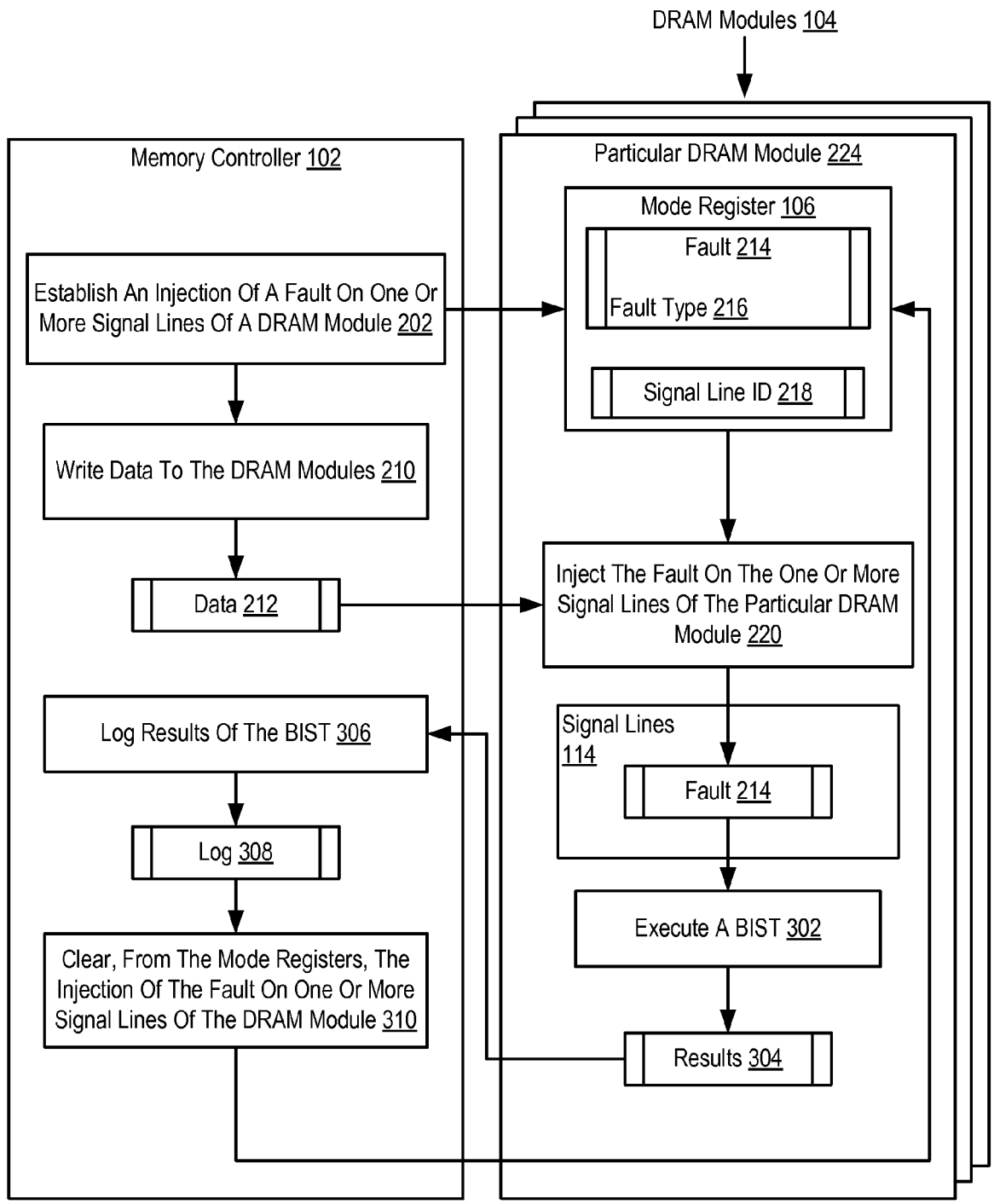
FIG. 3 sets forth a flow chart illustrating a further exemplary method for fault injection in dynamic random access memory ('DRAM') modules for performing built-in self-tests ('BISTs') according to embodiments of the present invention.

For further explanation, FIG. 3 sets forth a flow chart illustrating a further exemplary method for fault injection in dynamic random access memory ('DRAM') modules for performing built-in self-tests ('BISTs') according to embodiments of the present invention. The method of FIG. 3 is similar to the method of FIG. 4 in that the method of FIG. 4 also includes establishing (202), in the mode registers (106) of the DRAM modules (104) by the memory controller (102) through the shared address bus, an injection of a fault (214) into one or more signal lines (114) of a DRAM module (104), writing (210) data (212) by the memory controller (102) through a data bus to the DRAM modules (104), and injecting (220), by the particular DRAM module (224), the fault (214) characterized by the fault type (216) into the one or more signal lines (114) of the particular DRAM module (104).

The method of FIG. 3 differs from the method of FIG. 2, however, in that the method of FIG. 3 also includes executing (302), by the particular DRAM module (224), a BIST; logging (306), by the memory controller (102), results (304) of the BIST; and clearing (310), from the mode registers (106) of the DRAM modules (104) by the memory controller (102), the injection of the fault (214) into one or more signal lines of a DRAM module. In this way a memory controller may be configured to iteratively initiate execution of a series of BISTs on a DRAM module where each BIST includes a fault of a different type. That is, a memory controller may set a fault injection of one fault type, initiate a BIST on the DRAM module, clear the fault from the mode register, set a fault injection of another fault type, initiate another BIST of the DRAM module, clear the fault from the mode register and so on. By logging the results of each such BIST the memory controller generate a report of all BISTs run by the particular DRAM.

The DRAM module may be configured with one or more BIST that will execute when upon a fault injection. Consider as an example a BIST where the DRAM module determines the voltage levels at each pin of the DRAM module after a fault injection and reports the results of that determination. DRAM modules useful for fault injection according to embodiments of the present invention may be configured with a variety of BISTs as will occur to those of skill in the art. DRAM modules may use a data out signal line to report the results such a BIST to the memory controller.

Once the memory controller receives the results of the BIST the memory controller may log the results, that is, store the results in a data structure. Such a data structure may be useful during manufacture of multiple DRAM modules where each DRAM module must meet a minimum standard of operation to be put into production. After the results of the BIST are logged for later use, the memory controller (102) may clear the injection of the fault from the mode registers of the DRAM modules. The memory controller may clear the injection of the fault from the mode registers by setting address line connected to the fault injection segment of the mode register low or high. Assume for purposes of explanation that address line A3 is connected to the fault injection segment of the mode register and the DRAM module is configured such that to establish an injection of a fault, the fault injection segment of the DRAM module's mode register must be set high. To clear a fault injection then, the memory controller may set address line A3 low.

In this way a memory controller may be configured to iteratively initiate execution of a series of BISTs on a DRAM module where each BIST includes a fault of a different type. That is, a memory controller may set a fault injection of one fault type, initiate a BIST on the DRAM module, clear the fault from the mode register, set a fault injection of another fault type, initiate another BIST of the DRAM module, clear the fault from the mode register and so on. By logging the results of each such BIST the memory controller generate a report of all BISTs run by the particular DRAM.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of fault injection in dynamic random access memory ('DRAM') modules for performing built-in self-tests ('BISTs'), the DRAM modules managed by a memory controller, each DRAM module comprising a mode register, the mode registers of the DRAM modules connected to the memory controller through a shared address bus, each mode register comprising a segment indicating whether to inject a fault into one or more signal lines of a DRAM module, a segment identifying one or more signal lines of a DRAM module on which to inject a fault, and a segment including a fault type, the method comprising:

establishing, in the mode registers of the DRAM modules by the memory controller through the shared address bus, an injection of a fault into one or more signal lines of a DRAM module, the fault characterized by a fault type;

writing data by the memory controller through a data bus to the DRAM modules, the data identifying a particular DRAM module; and responsive to receiving the data, injecting, by the particular DRAM module, the fault characterized by the fault type into the one or more signal lines of the particular DRAM module.

2. The method of claim 1 further comprising:

executing, by the particular DRAM module, a BIST;

logging, by the memory controller, results of the BIST; and clearing, from the mode registers of the DRAM modules by the memory controller, the injection of the fault into one or more signal lines of a DRAM module.

3. The method of claim 1 wherein establishing an injection of a fault into one or more signal lines of a DRAM module further comprises:

setting a segment of the mode registers of the DRAM modules to indicate that a fault is to be injected into one or more signal lines of a DRAM module, setting a segment of the mode registers to identify one or more signal lines of a DRAM module on which to inject the fault; and setting a segment of the mode registers to identify a fault type.

4. The method of claim 1 wherein injecting the fault characterized by the fault type into the one or more signal lines of the particular DRAM module:

determining, by the particular DRAM module from a segment of the particular DRAM module's mode register, that a fault is to be injected into one or more signal lines of the particular DRAM;

identifying, by the particular DRAM module from a segment of the particular DRAM module's mode register, the one or more signal lines on which to inject the fault; and identifying, by the particular DRAM module from a segment of the particular DRAM module's mode register, the fault type of the fault to inject.

5. The method of claim 1 wherein injecting, by the particular DRAM module, the fault characterized by the fault type on the one or more signal lines of the particular DRAM module includes forcing one or more signal lines high.

6. The method of claim 1 wherein injecting, by the particular DRAM module, the fault characterized by the fault type on the one or more signal lines of the particular DRAM module includes forcing one or more signal lines low.

7. The method of claim 1 wherein injecting, by the particular DRAM module, the fault characterized by the fault type on the one or more signal lines of the particular DRAM module includes electrically disconnecting the one or more signal lines.

8. The method of claim 1 wherein injecting, by the particular DRAM module, the fault characterized by the fault type on the one or more signal lines of the particular DRAM module includes introducing crosstalk between one or more signal lines.

9. An apparatus for fault injection in dynamic random access memory ('DRAM') modules for performing built-in self-tests ('BISTs'), the DRAM modules managed by a memory controller, each DRAM module comprising a mode register, the mode registers of the DRAM modules connected to the memory controller through a shared address bus, each mode register comprising a segment indicating whether to inject a fault into one or more signal lines of a DRAM module, a segment identifying one or more signal lines of a DRAM module on which to inject a fault, and a segment including a fault type, the apparatus comprising a computer processor, a computer memory operatively coupled to the computer processor, the computer memory having disposed within it computer program instructions capable of:

establishing, in the mode registers of the DRAM modules by the memory controller through the shared address bus, an injection of a fault into one or more signal lines of a DRAM module, the fault characterized by a fault type;

writing data by the memory controller through a data bus to the DRAM modules, the data identifying a particular DRAM module; and responsive to receiving the data, injecting, by the particular DRAM module, the fault characterized by the fault type into the one or more signal lines of the particular DRAM module.

10. The apparatus of claim 9 further comprising computer program instructions capable of:

executing, by the particular DRAM module, a BIST;

logging, by the memory controller, results of the BIST; and clearing, from the mode registers of the DRAM modules by the memory controller, the injection of the fault into one or more signal lines of a DRAM module.

11. The apparatus of claim 9 wherein establishing an injection of a fault into one or more signal lines of a DRAM module further comprises:

setting a segment of the mode registers of the DRAM modules to indicate that a fault is to be injected into one or more signal lines of a DRAM module, setting a segment of the mode registers to identify one or more signal lines of a DRAM module on which to inject the fault; and setting a segment of the mode registers to identify a fault type.

12. The apparatus of claim 9 wherein injecting the fault characterized by the fault type into the one or more signal lines of the particular DRAM module:

determining, by the particular DRAM module from a segment of the particular DRAM module's mode register, that a fault is to be injected into one or more signal lines of the particular DRAM;

identifying, by the particular DRAM module from a segment of the particular DRAM module's mode register, the one or more signal lines on which to inject the fault; and identifying, by the particular DRAM module from a segment of the particular DRAM module's mode register, the fault type of the fault to inject.

13. The apparatus of claim 9 wherein injecting, by the particular DRAM module, the fault characterized by the fault type on the one or more signal lines of the particular DRAM module includes forcing one or more signal lines high.

14. The apparatus of claim 9 wherein injecting, by the particular DRAM module, the fault characterized by the fault type on the one or more signal lines of the particular DRAM module includes forcing one or more signal lines low.

15. The apparatus of claim 9 wherein injecting, by the particular DRAM module, the fault characterized by the fault type on the one or more signal lines of the particular DRAM module includes electrically disconnecting the one or more signal lines.

16. The apparatus of claim 9 wherein injecting, by the particular DRAM module, the fault characterized by the fault type on the one or more signal lines of the particular DRAM module includes introducing crosstalk between one or more signal lines.

17. A dynamic random access memory ('DRAM') module for fault injection for performing built-in self-tests ('BISTs'), the DRAM module comprising:

a mode register, the mode register connected to a memory controller through a shared address bus, the mode register comprising:

a segment indicating whether to inject a fault into one or more signal lines of the DRAM module;

a segment identifying one or more signal lines of the DRAM module on which to inject a fault; and a segment including a fault type.

* * * * *